United States Patent [19]
Redford

[11] Patent Number: 5,870,581
[45] Date of Patent: Feb. 9, 1999

[54] METHOD AND APPARATUS FOR PERFORMING CONCURRENT WRITE OPERATIONS TO A SINGLE-WRITE-INPUT REGISTER FILE AND AN ACCUMULATOR REGISTER

[75] Inventor: John L. Redford, Cambridge, Mass.

[73] Assignee: Oak Technology, Inc., Sunnyvale, Calif.

[21] Appl. No.: 770,540

[22] Filed: Dec. 20, 1996

[51] Int. Cl.[6] ........................................ G06F 9/38
[52] U.S. Cl. .................... 395/394; 345/522; 345/523; 711/150; 711/149; 711/168; 711/169
[58] Field of Search .................... 345/522, 523; 711/150, 168, 169, 149; 395/394

[56] References Cited

U.S. PATENT DOCUMENTS

| | | | |
|---|---|---|---|
| 3,188,386 | 6/1965 | Byatt . | |
| 3,483,511 | 12/1969 | Rabinow . | |
| 3,569,616 | 3/1971 | Baker | 178/6.8 |
| 3,611,260 | 10/1971 | Colardeau | 339/89 R |
| 3,629,495 | 3/1969 | Cahill | 178/6.6 A |
| 3,676,850 | 7/1972 | Goldman et al. | 340/154 |
| 3,792,194 | 2/1974 | Wood et al. | 178/6.8 |
| 3,803,445 | 4/1974 | Wagner | 315/18 |
| 3,902,047 | 8/1975 | Tyler et al. | 235/61.11 |
| 3,922,059 | 11/1975 | Noguchi | 350/3.5 |
| 3,925,765 | 12/1975 | Berwin et al. | 340/172.5 |
| 3,959,582 | 5/1976 | Law et al. | 178/6.8 |
| 3,976,982 | 8/1976 | Eiselen | 340/172.5 |
| 4,002,827 | 1/1977 | Nevin et al. | 3435/140 |
| 4,075,692 | 2/1978 | Sorensen et al. | 711/149 |
| 4,125,862 | 11/1978 | Catano | 358/140 |
| 4,168,488 | 9/1979 | Evans | 340/146.3 |
| 4,271,476 | 6/1981 | Lotspiech | 364/515 |
| 4,467,448 | 8/1984 | Regehr et al. | 364/900 |
| 4,476,525 | 10/1984 | Ishii | 395/394 |
| 4,545,069 | 10/1985 | Kermisch | 382/46 |
| 4,627,020 | 12/1986 | Anderson et al. | 364/900 |
| 4,658,430 | 4/1987 | Anderson et al. | 382/46 |
| 4,776,026 | 10/1988 | Ueyama | 382/46 |
| 4,783,834 | 11/1988 | Anderson et al. | 382/46 |
| 4,837,845 | 6/1989 | Pruett et al. | 382/46 |
| 4,970,682 | 11/1990 | Beckwith, Jr. et al. | 364/900 |
| 4,975,977 | 12/1990 | Kurosu et al. | 382/46 |
| 5,034,733 | 7/1991 | Okazawa et al. | 340/727 |
| 5,081,700 | 1/1992 | Crozier | 395/150 |
| 5,111,192 | 5/1992 | Kadakia | 340/727 |
| 5,123,108 | 6/1992 | Olson et al. | 395/394 |
| 5,199,101 | 3/1993 | Casick et al. | 395/115 |
| 5,222,240 | 6/1993 | Patel | 395/775 |
| 5,295,237 | 3/1994 | Park | 395/137 |
| 5,341,482 | 8/1994 | Cutler et al. | 395/591 |
| 5,365,601 | 11/1994 | Kadakia et al. | 382/46 |
| 5,396,236 | 3/1995 | Ueda | 341/50 |
| 5,426,743 | 6/1995 | Phillips et al. | 395/562 |
| 5,450,604 | 9/1995 | Davies | 395/800 |
| 5,483,354 | 1/1996 | Kessels et al. | 358/444 |
| 5,557,715 | 9/1996 | Ichiyanagi | 395/137 |
| 5,655,132 | 8/1997 | Watson | 395/674 |
| 5,666,300 | 9/1997 | Adelman | 364/736.05 |

FOREIGN PATENT DOCUMENTS

| | | |
|---|---|---|
| 0 425 410 A2 | 5/1991 | European Pat. Off. . |
| 2 234 833 A | 2/1991 | United Kingdom . |
| 2 296 118 A | 6/1996 | United Kingdom . |

Primary Examiner—Parshotam S. Lall
Assistant Examiner—Khanh Quang Dinh
Attorney, Agent, or Firm—Testa, Hurwitz & Thibeault, LLP

[57] ABSTRACT

A microchip has a register file having a plurality of registers and an accumulator register connected in parallel with the register file that allow write operations to be performed concurrently during a single write cycle. Write operations can include write data to be written to a destination register and identification data designating a destination register. Where a first instruction designates a register in a register file and second instruction designates an accumulator register, write data from the first and second instructions can be written concurrently to the register file and the accumulator register during a single write cycle. By providing an accumulator register that is separate from the register file, data directed toward an accumulator register is diverted away from the register file and delays in performing write operations to the register file are reduced.

15 Claims, 4 Drawing Sheets

METHOD AND APPARATUS FOR PERFORMING CONCURRENT WRITE OPERATIONS TO A SINGLE-WRITE-INPUT REGISTER FILE AND AN ACCUMULATOR REGISTER

FIELD OF THE INVENTION

This invention relates generally to performing concurrent write operations to registers embodied in an image processing chip. In particular, this invention relates to performing concurrent write operations to a single-write-input register file and an accumulator register.

BACKGROUND OF THE INVENTION

Pixels in an image can be represented by a pattern of bits having values indicative of luminescence levels. Image processing tasks often require the addition of bits to obtain relative intensity levels, achieve smoothing, and convert an image from one dot per inch (dpi) value to another. Generally, as the complexity of the operation increases, the number of read and write operations necessary to perform the operation also increases. For example, converting one dpi value to another dpi value involves a series of operations, such as reading bit values, combining bit values, writing bit values and incrementing register locations.

These operations often result in data being written to various registers in a single register file. As the register file typically has a single write port, such data must be written to the registers in succession. When a number of data values are waiting to be written, the probability of certain values being written after a significant period of delay increases. Delays in writing data values to register locations that exceed a number of milliseconds can lead to processing delays, system errors and system malfunction. Conventional image processing systems have attempted to solve this problem by providing two separate write ports on each register file. Although this solution is effective, the additional circuitry required to implement the additional write port increases the fabrication costs as well as the complexity of the image processing system.

SUMMARY OF THE INVENTION

The method and apparatus of the present invention enables data to be written concurrently to a single-write-input register file and an accumulator register disposed externally to a register file during a single write cycle. The present invention can be used to avoid delays associated with the buildup of pending requests for use of the write port of a single-write-input register file.

In image processing operations, the accumulator register typically receives a number of instructions for data writes to the accumulator register. By providing an accumulator register that is physically separate from and in parallel with the register file, data can be is written directly to the accumulator register through a write port associated with the accumulator register. By diverting certain data such away from the register file and to the accumulator register, concurrent write operations can be performed at the register file and the accumulator register. The present invention reduces delays associated with write operations at the register file by diverting a portion of the write operation to the write port associated to the accumulator.

The apparatus of the present invention comprises a microchip including a register file having a plurality of registers sharing a common write port, and an accumulator register having a write port disposed in parallel with the register file. In one embodiment, the method of concurrently writing data to the register file and the accumulator register during a write cycle comprises: (1) receiving a pair of write instructions, each instruction including write data to be written to a destination register, and identification data designating a destination register; (2) analyzing the identification data for each instruction to determine the destination registers in each instruction; and (3) concurrently writing the write data to the destination registers during a single write cycle when one of the destination registers is the accumulator register.

When the destination register in the instruction comprises a register in the register file, the write data can be written to the destination registers in succession. During a single write cycle, data can be written from a first instruction to a destination register in the register file, and data can be written from a second instruction to a temporary register until the write port of the register file is free. During a subsequent write cycle, the write port of the register file is free, and data from the second instruction can be written to the register file.

The foregoing and other objects, features, and advantages of the invention will be come apparent from the following, more particular description of the preferred embodiments of the invention, as illustrated in the accompanying drawings.

DETAILED DESCRIPTION OF THE INVENTION

Figure 1:
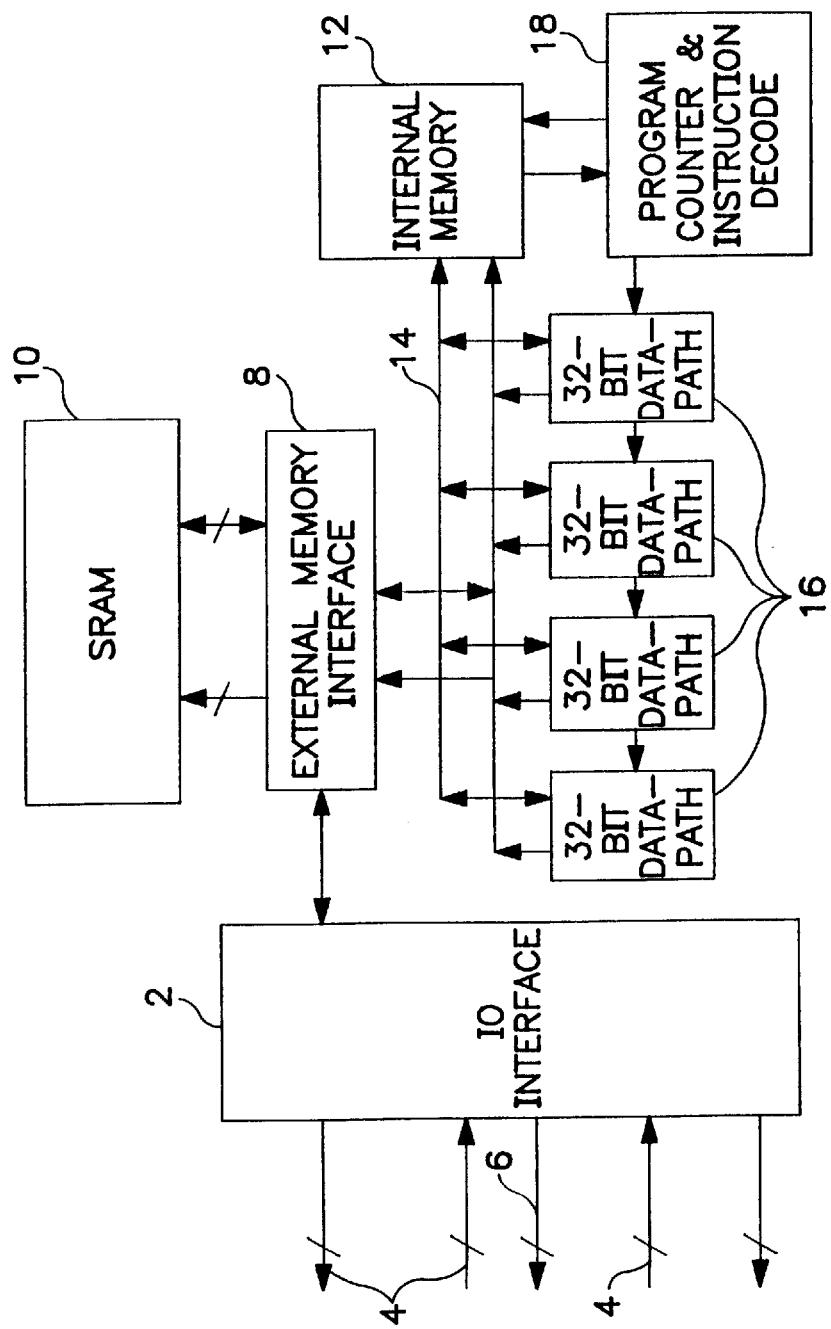
FIG. 1 is a block diagram of an apparatus for performing image processing operations according to one embodiment of the present invention.

Referring to FIG. 1, a block diagram of an image processing system in which the apparatus for performing concurrent write operations according to the present invention can be embodied is shown. The apparatus shown in this figure can exist in an image processing chip (hereinafter "microchip") that interfaces with a standard microprocessor (not shown) used for image processing. An input-output interface 2 (hereinafter "I/O interface") receives over a plurality of input lines 4, commands from the microprocessor, as well as commands from peripheral devices such as scanners, printers and facsimile machines (not shown). The I/O interface 2 transmits data to such devices over a plurality of output lines 6. The I/O interface 2 is coupled to an external memory interface 8 that transfers data to and from an SRAM 10. Such data typically includes image data and can include instruction data (hereinafter interchangeably referred to as "instructions" "operations" or "microcode").

The internal memory module 12 can also store microcode. The internal memory module 12 interfaces with a plurality of datapaths 16 over a bus 14. In the present embodiment, each datapath 16 includes a register file (not shown) and a plurality of modules (not shown) for performing certain operations, such as, for example, multiplication and addition. In the present embodiment, the register file comprises thirty-one (31) general purpose registers, each of which is about thirty-two (32) bits in length. A register associated with, but separate from, the register file is an accumulator register (not shown) that controls various portions of the datapath and is frequently written to during image processing operations. As further described, the accumulator register includes a write port separate from the write port of the associated register file, thus freeing the write port of the register file from being clogged with pending write operations (hereinafter interchangeably referred to as "write requests" and "requests").

Once data is stored in the SRAM 10, microcode instructions stored in the internal memory module 12 can read and manipulate the data, causing data to flow to the datapaths 16 via the external memory interface 8. Each datapath 16 supplies an address to the data transferred from the SRAM 10. Data is manipulated in the datapaths 16 and the results of such manipulation can be written back to the SRAM 10. A program counter and instruction decoder 18 (hereinafter PCID) interfaces with internal memory module 12 and the datapaths 16. The PCID 18 can receive instructions from the internal memory module 12, decode them and transfer them to the datapaths 16. The PCID 18 additionally serves as a counter.

Figure 2:
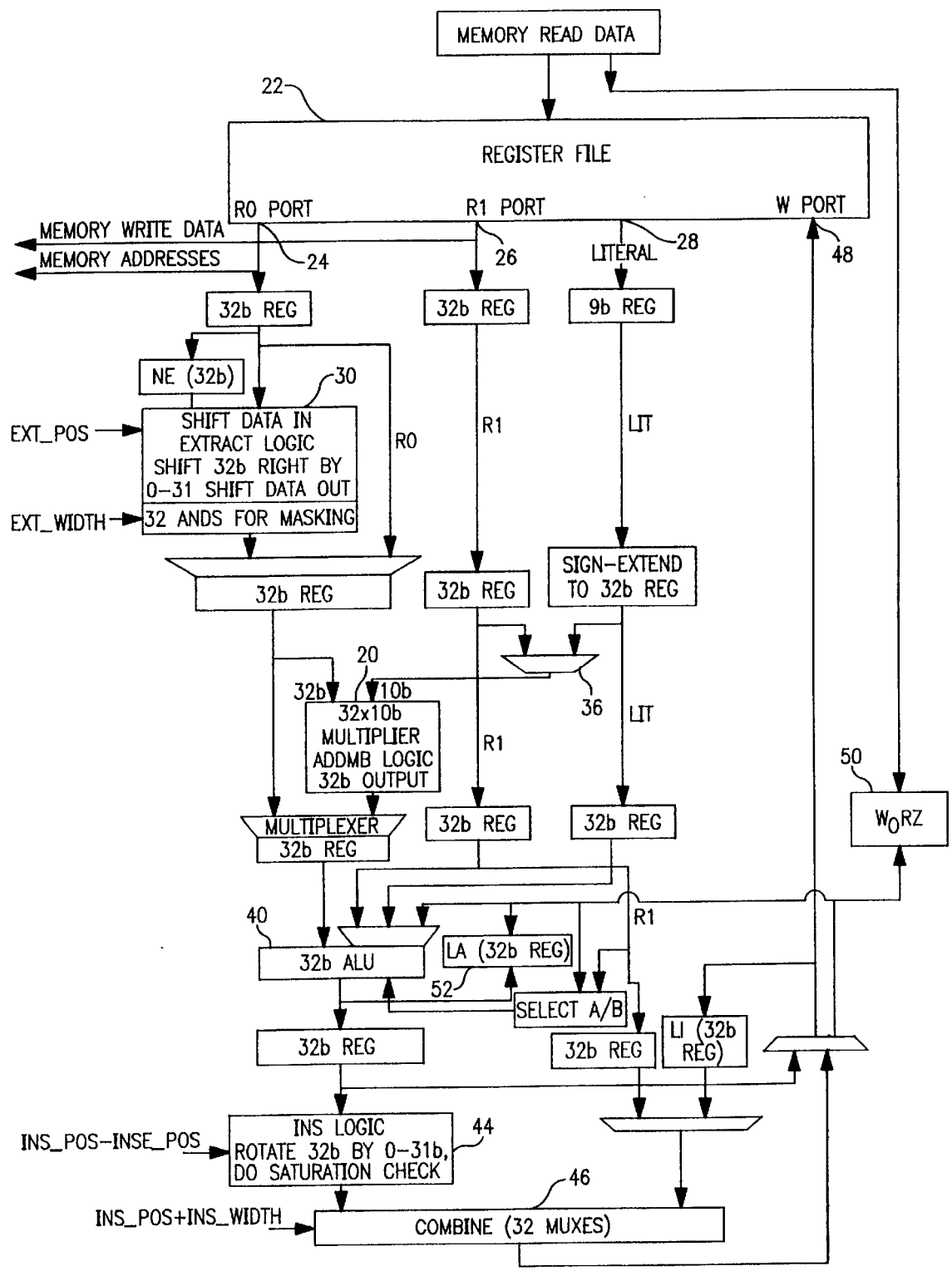
FIG. 2 is a block diagram, showing in further detail, a datapath for performing concurrent write operations according to one embodiment of the present invention.

Referring to FIG. 2, a block diagram of a datapath 16 according to one embodiment of the invention is shown. A register file 22 receives memory data from the SRAM 10. In the present embodiment, data typically undergoing an operation is in the form of a thirty-two (32) bit word, comprising four (4) bytes, each of which is eight (8) bits in length. Eight (8) bits is usually the standard pixel image length due to the limitations of the human eye. Such binary data is outputted from the register file 22 through ports 24, 26, designated R0 and R1.

Data from port R0 can be transferred to an extractor 30 for extracting any contiguous bit field. A multiplier 20 can multiply or perform a masked-byte add on the data outputted from ports R0 and R1. Applicant hereby incorporates by reference Applicant's co-pending U.S. patent application, filed of even date herewith, entitled "Method and Apparatus for Performing a Masked Byte Addition Operation," which describes the use of the datapath shown in FIG. 2 to perform an add-masked byte operation. An arithmetic logic unit 40 (hereinafter "ALU") can receive data directly from the R0 and R1 ports or from the multiplier 39, and can perform an add, subtract, logical AND or a logical OR. The ALU 40 can further perform comparisons on the values outputted from the R0 and R1 ports and the accumulator register 50. An inserter, shown by INS logic 44, can extract a contiguous bit field of up to 32 bits from the output of the ALU. The combination unit 46 can combine values from the R0 and R1 ports and transfer a resulting value to either a write port associated with the register file 22 or the accumulator register 50, as further described. Data is written to the register file 22 at write port $W_1$ and written to the accumulator register at write port $W_0$.

The accumulator register 50 typically associated with the register file 22 is shown in parallel with the register file 22. When data is written to the accumulator register 50, it has the added feature of causing an accumulator unit 52 to be loaded. An accumulator unit 52 is frequently used in image processing operations due to its ability to performs a series of operations in succession and use operands from current operations in such successive operations. As a result of the link between the accumulator register 50 with the accumulator unit 52, a greater amount of data is typically written to the accumulator register 50 than is written than the other registers associated with the register file 22. Therefore, should the accumulator register 50 reside within the register file 22, a large number of requests would be sent to the write port $W_1$ on the register file 22 for transfer to the accumulator register 50. By providing the accumulator register 50 with a write port separate from the register file 22, the number of requests sent to the write port of the register file 22 decreases.

The microcode instructions cause data to be written to the various registers, thus data addressed to the accumulator register 50 is transferred only to the accumulator register 50, and not to the associated register file 22. The format of a microcode instruction operation is preferably 32 bits long, with several bits allocated to instruction code and several bits allocated to the registers specification. As shown in Table A, bits designated "OPCODE" specify the function to be performed (i.e. multiplication, addition, logical AND, logical OR). In the present embodiment, eight bits can be allocated to "OPCODE." Bits allocated to the designation of "R0" specify the register that includes the word that is to be inputted to an operation module such as the multiplier or the ALU. In the present embodiment, five bits can be allocated to "R0." Bits allocated to the "R1"operand specifies the register that includes a byte, such as a mask byte, to be inputted to the multiplier. In the present embodiment, five bits can be allocated to "R1." Bits allocated to "LIT" specify a constant that can be used in a multiplication operation. In the present embodiment, nine bits can be allocated to "LIT." Bits allocated to the designation of "W" specify the register that sum and products can be written to after processing is complete. In the present embodiment, five bits can be allocated to "W." Data can thus be written to the accumulator register 50 by specifying at location W, the address of accumulator register in the microcode instruction. Data can be written to registers in the register file by specifying such registers in the instruction.

TABLE A

| OPCODE | R0 | RI | W | LIT |
|---|---|---|---|---|
| 01001010 | 00010 | 00001 | 00000 | 010100011 |
| 01001010 | 00010 | 00001 | 01000 | 010100011 |

As shown in Table A, a sample instruction that routes data to the accumulator register 50 appears in the second row and includes a binary zero value in location W, specifying register zero. The third row shows an instruction that routes data to a register in the register file 22. As shown, in location W, a binary eight value indicates that a register in the register file 22 (i.e., register eight) will receive the data. The data associated with these instructions can be written concurrently during the same write cycle, that is, data can be written to the register file 22 at the same time data is written to the accumulator register 50, because data going to the accumulator 50 is diverted away from the write port of register file 22.

Figure 3:
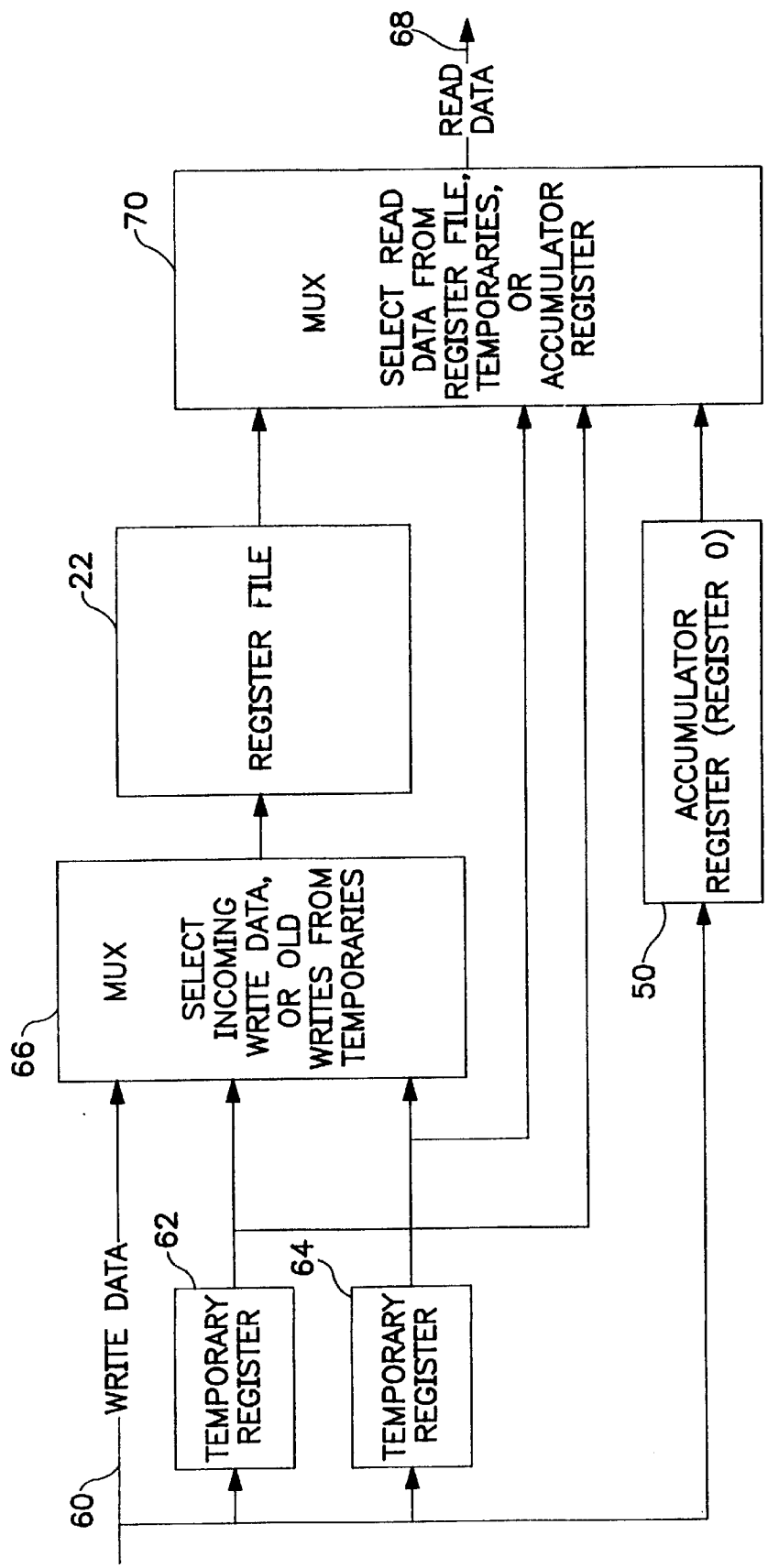
FIG. 3 is a diagrammatic illustration of the register file and the accumulator register in a write cycle according to one embodiment of the present invention.

Referring to FIG. 3, a diagrammatic illustration of the register file 22 and the accumulator register 50 for carrying out the present invention is shown. Input line 60 receives instruction data that includes destination data and write data to be written to the register file 22 or the accumulator register 50. The input line is electrically connected to a pair of temporary registers 62, 64, an input multiplexer 66, and the accumulator register 50. The input multiplexer 66 selects between write data waiting in the temporary registers 62, 64 and input write data on input line 60, and transfers data from such locations to the register file 22. An output line 68 communicates with an output multiplexer 70 and receives data read from each of, the temporary registers 62, 64, the register file 22, and the accumulator register 50, as further described below.

Data to be written to the accumulator register 50 or the register file 22 is transferred over the input line 60 and routed according to the address given in the instruction. As described above, where a register address of zero is in the instruction, the data is to be written to the accumulator register 50. When a register address is a non-zero value, the data is to be written to the register file 22. Data is written to a register during to a "write cycle." In the present embodiment, a write cycle can take anywhere from one to about four periods from the time an instruction is issued until the output of the instruction is stored in the destination register.

An example of a write cycle is shown in Table B with operations written in the programming language "C." Referring to the first line of Table B, a write operation is specified for register qnDest, which is a register in the register file. In the present embodiment, four periods are required before this data will be written to the register file 22. Therefore, the data from first instruction is not written into qnDest, a register in the register file 22, until after the MEM instruction has occurred.

TABLE B qnDest = qnSource * 5 + qnOffset
qnJunk = INS (qnJunk, Li)
LOAD (EXT-POS, 8)
LOAD (EXT-WIDTH,8)
qnMemNum = MEM (qpAdr)

While data is waiting to be written to the register file 22, it is held in one of the temporary registers 62, 64. When the fourth period is over, the input multiplexer 66 determines whether the data can be written to the register file 22, and if the input multiplexer 66 makes an affirmative determination, data is written to the register file 22, particularly, to the register specified in the instruction.

Additional write data designating the register file 22 can be transferred to the input multiplexer 66 over the input line 60 during the fourth period. Should the input multiplexer 66 prioritize such data ahead of the data waiting in the temporary register, such data is written to the register file 22. In such a case, the data waiting in the temporary register 62 remains in the temporary register 62 for at least another cycle. Thereafter, the input multiplexer 66 determines whether the data from the temporary register 62 should be transferred to the register file 22. In this manner, the temporary registers 62, 64 store data that was attempted to be written to the register file 22 during the earlier write cycle.

The accumulator register 50 is shown in parallel with the register file 22, and is independent from the register file 22 and the input multiplexer 66. As a result of the independent configuration of the accumulator register 50, the data in a write operation designating the accumulator register 50 can be written to the accumulator register as the above-described operations are taking place in the register file 22. Thus, when incoming data on line 60 designates register location zero, the data is automatically transferred to the accumulator register 50, and a write operation to the accumulator register 50 and an accumulator unit (not shown) is made, notwithstanding any existing backlog at the register file 22. Where two write operations are requested over input line 60, and one designates a register in the register file 22 and the other designates the accumulator register 50. Thus, data can be written concurrently to both the register file 22 and the accumulator register 50. Alternatively, data can be concurrently written to a temporary register 62, 64 and the accumulator register 50 when the write port at the register file 22 is busy.

The temporary registers 62, 64, the register file 22, and the accumulator register 50 are each in series with the output multiplexer 70. The output multiplexer 70 can output data stored in the temporary register 62, 64 or data already written to the register file 22 for further processing. The output multiplexer 70 selects data from a temporary register 62, 64, typically when the data stored therein is required shortly for another operation. Selection of data from a temporary register 62, 64, thus decreases the delay time involved in waiting for data to be written from the temporary register 62, 64 to the register file 22 before being accessed for a subsequent operation.

Figure 4:
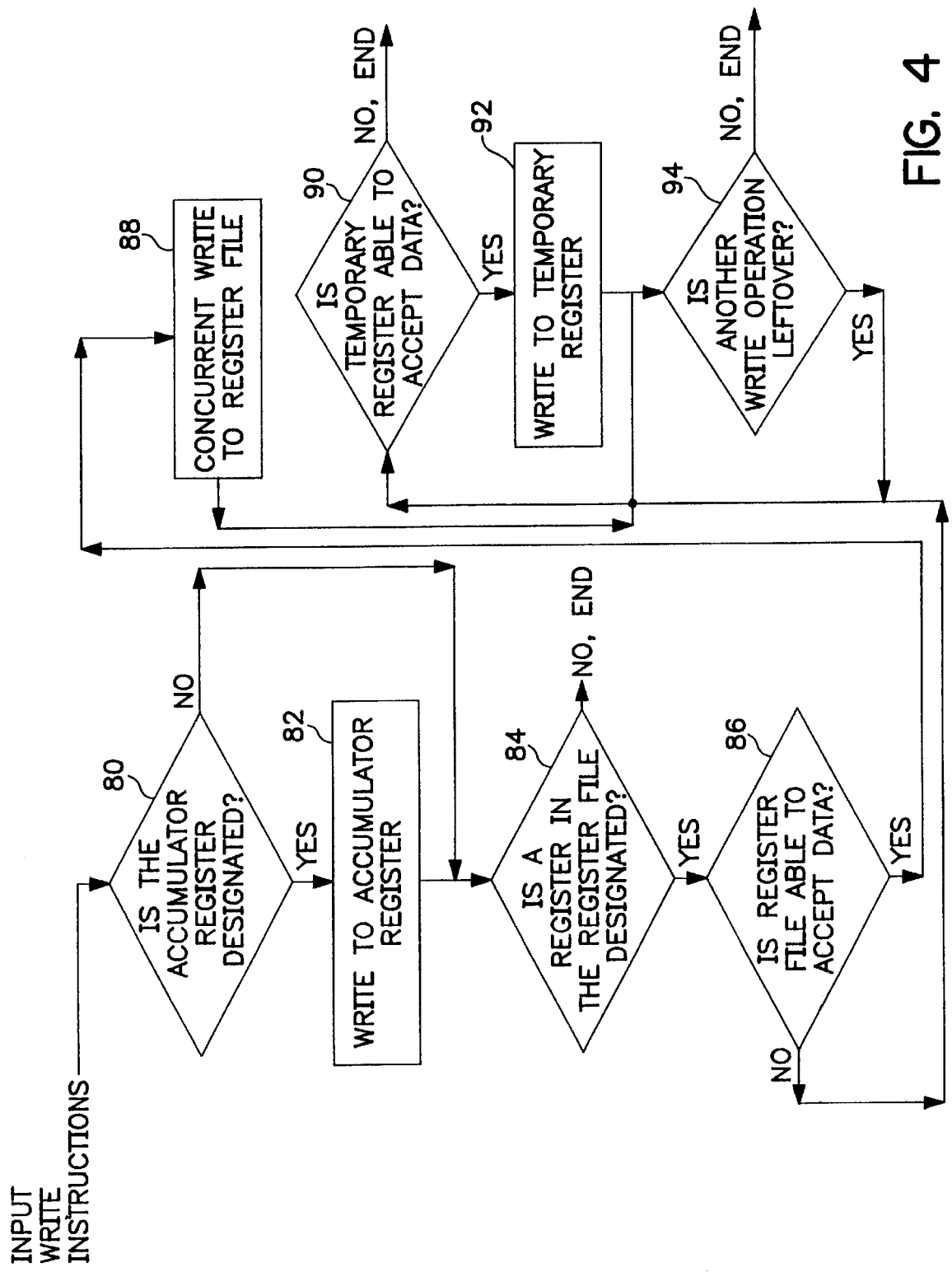
FIG. 4 is a flow chart illustrating a method of performing a concurrent write operation according to one embodiment of the present invention.

Referring FIG. 4, a flow chart illustrating the steps that can occur when two write operations are active during the same write cycle, according to one embodiment of the present invention is shown. This flow chart commences at step 80 with two input write instructions requesting to write data to two registers. In step 80, a determination is made as to whether one of the write instructions designates an accumulator register. If an accumulator register is designated, data is written to the accumulator in step 82. After a write occurs in this step, control passes to step 84 where a determination is made as to whether the remaining write instruction specifies a register in the register file. Similarly, if an accumulator register is not designated in step 80, control passes to step 84 and such a determination is made. If a register file is designated in step 84, a determination is made in step 86 as to whether the register file can accept data during the next available cycle. If the register file can accept data, control passes to step 88 and the data is written to a register in the register file. Note that this write operation typically occurs concurrently with the write to the accumulator register as given in step 82. Control then passes to step 94.

If the register file cannot accept data, control is routed to step 90, and a determination is made as to whether the temporary register can accept the data. If affirmative, the data is written to the temporary register in step 92. Control then passes to step 94, where a determination is made as to whether an additional write instruction remains. This determination is also made after step 88, after the register file accepts data. If affirmative, control is routed to step 90, where a determination is made as to whether a temporary register can accept the data, and operations 92 and 94 are again performed.

The use of an accumulator register external to a register file, as described above, frees the write port at the register file from the high-traffic write operations associated with the accumulator register, and thus increases the efficiency and performance of image processing operations.

While the invention has been particularly shown and described with reference to the preferred embodiments, it should be understood by those skilled in the art that various changes in form and detail may be made therein without departing from the spirit and scope of the invention as defined by the appended claims.

I claim:

1. In a microchip having destination registers including a register file comprising a plurality of registers sharing a common write port, and an accumulator register having a write port, a method for concurrently writing data to the register file and the accumulator register during a write cycle, comprising:

receiving a pair of instructions, each instruction including write data to be written to a destination register, and identification data designating a destination register;

analyzing the identification data for each instruction to determine the destination registers;

concurrently writing the write data to the destination registers during a single write cycle when one of the destination registers is the accumulator register;

determining identification data in a first instruction having a zero value; and determining that the identification data in the first instruction specifies an accumulator register.

2. The method of claim 1, further comprising:

writing the write data to the destination registers in succession when each destination register comprises a register in the register file.

3. The method of claim 2, further comprising:

writing write data from a first instruction to a register in the register file; and writing write data from a second instruction to a temporary register.

4. The method of claim 3, wherein the write data from the first instruction and the write data from the second instruction is written during a single write cycle.

5. The method of claim 3, further comprising:

writing the write data from the temporary register to a register in the register file during a subsequent write cycle.

6. The method of claim 1, further comprising:

determining identification data in a second instruction having a non-zero value; and determining that the identification data in the second instruction specifies a register in the register file.

7. The method of claim 1, wherein the register file comprises thirty one registers, each register having thirty-two bits.

8. An apparatus used for performing image processing operations, the apparatus being embodied in a microchip comprising:

an input/output interface for transferring data;

a register file in communication with the input/output interface having a first write port for receiving the data, the register file comprising a plurality of registers linked through a bus;

a plurality of temporary registers in communication with the input/output interface and electrically connected in series with the register file;

an accumulator register in communication with the input/output interface and electrically connected in parallel with the register file, the accumulator register having a second write port; and an accumulator unit electrically connected to the accumulator register for receiving the data written to the second write port;

wherein data transferred over the input/output interface is written to the first and second write ports during a single write cycle.

9. The apparatus of claim 8, further comprising:

a multiplexer electrically connected between the temporary registers and the register file for selectively enabling a temporary register and the input/output interface for transfer of data to the first write port.

10. The apparatus of claim 8, further comprising:

a multiplier electrically coupled to the register file for receiving data from the register file and performing a multiplication operation thereon.

11. The apparatus of claim 8, wherein the temporary registers write data to the first write port during a successive write cycle.

12. The apparatus of claim 8, further comprising:

an arithmetic logic unit electrically coupled to the register file for receiving data from the register file and performing an addition operation thereon.

13. The apparatus of claim 8, wherein each of the plurality of registers have a length of 32 bits.

14. An apparatus used for performing image processing operations, the apparatus being embodied in a microchip comprising:

an input/output interface for transferring data;

a register file in communication with the input/output interface having a first write port for receiving the data, the register file comprising a plurality of registers linked through a bus;

a plurality of temporary registers in communication with the input/output interface and electrically connected in series with the register file; and an accumulator register in communication with the input/output interface and electrically connected in parallel with the register file, the accumulator register having a second write port;

wherein data transferred over the input/output interface is written to the first and second write ports during a single write cycle and data specifying an address greater than zero is written to one of the plurality of registers.

15. An apparatus used for performing image processing operations, the apparatus being embodied in a microchip comprising:

an input/output interface for transferring data;

a register file in communication with the input/output interface having a first write port for receiving the data, the register file comprising a plurality of registers linked through a bus;

a plurality of temporary registers in communication with the input/output interface and electrically connected in series with the register file; and an accumulator register in communication with the input/output interface and electrically connected in parallel with the register file, the accumulator register having a second write port;

wherein data transferred over the input/output interface is written to the first and second write ports during a single write cycle and data specifying an address equal to zero is written to the accumulator register.

* * * * *